United States Patent [19]

Giovanni et al.

[11] 4,214,953

[45] Jul. 29, 1980

[54] PROCESS FOR MAKING SEMICONDUCTOR DEVICES PASSIVATED BY AN INTEGRATED HEAT SINK

[76] Inventors: Greco Giovanni, via Monte Senario 41, Rome, Italy, 00141; Maurizio Tomassini, via Cassia 1020, Rome, Italy, 00189

[21] Appl. No.: 852,156

[22] Filed: Nov. 16, 1977

[30] Foreign Application Priority Data

Nov. 16, 1976 [IT] Italy ................................ 52207 A/76

[51] Int. Cl.² ........................ C25D 5/02; C23C 15/00; C25D 7/12
[52] U.S. Cl. .................................... 204/15; 204/38 B; 204/192 S
[58] Field of Search .................. 204/15, 192 C, 192 S, 204/38 B, 38 S, 192 E

[56] References Cited

U.S. PATENT DOCUMENTS

| | | | |
|---|---|---|---|
| 4,007,104 | 2/1977 | Summers | 204/192 E |
| 4,052,269 | 10/1977 | Michel | 204/15 |
| 4,099,318 | 7/1978 | Cooper | 204/15 |
| 4,104,090 | 8/1978 | Pogge | 204/15 |

*Primary Examiner*—T. M. Tufariello
*Attorney, Agent, or Firm*—Holman & Stern

[57] ABSTRACT

A method of making semiconductor devices passivated by an integrated heat sink comprises a layer-by-layer buildup of a silicon-based laminate, the creation of Mesa structures on one face of the laminate and of dissipator seats on the other face of the laminate by marking and etching processes, carrying out electrolytic growth of silver thermal dissipators and forming a metallic sheet and adhering same only to a selected exposed silicon N area.

5 Claims, 6 Drawing Figures

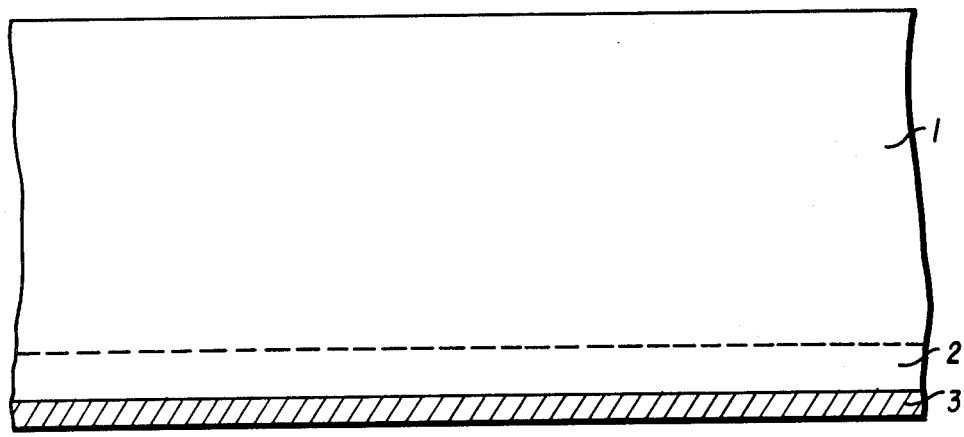
FIG. 1
FIG. 2
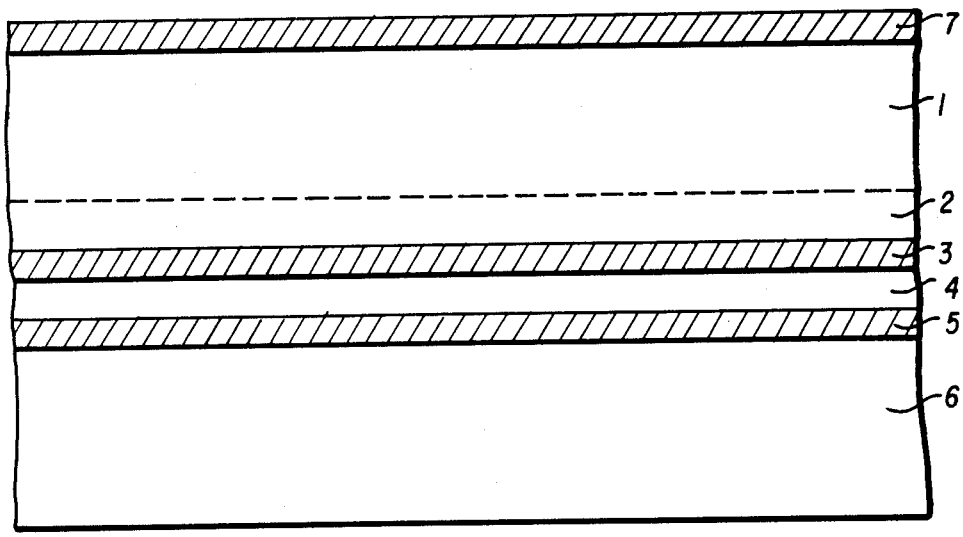

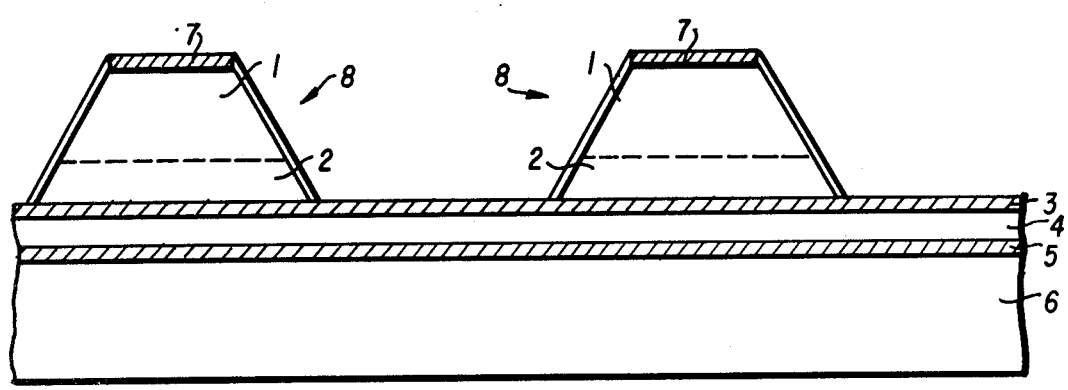
FIG. 3
FIG. 4
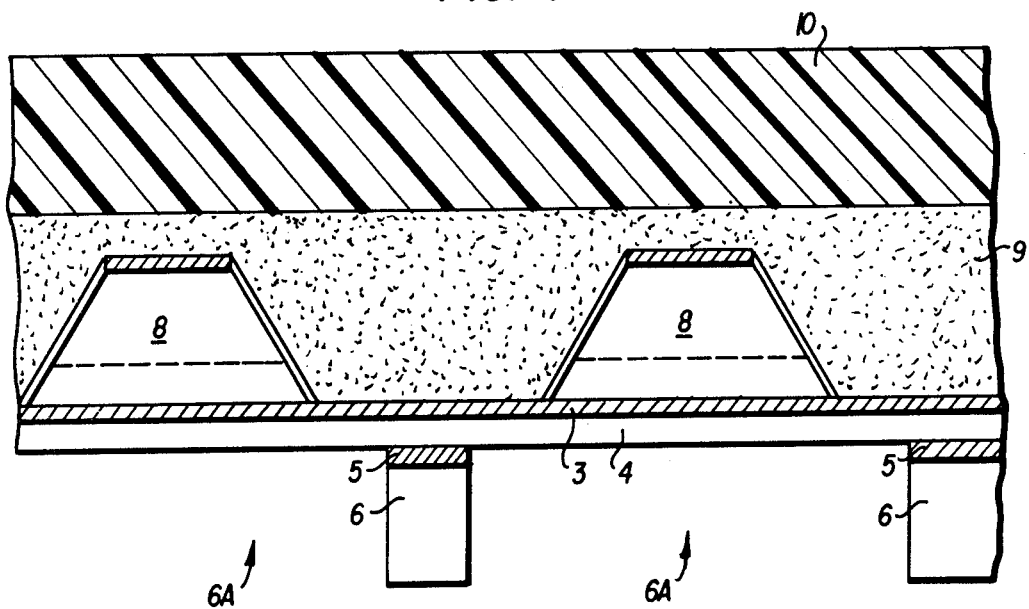

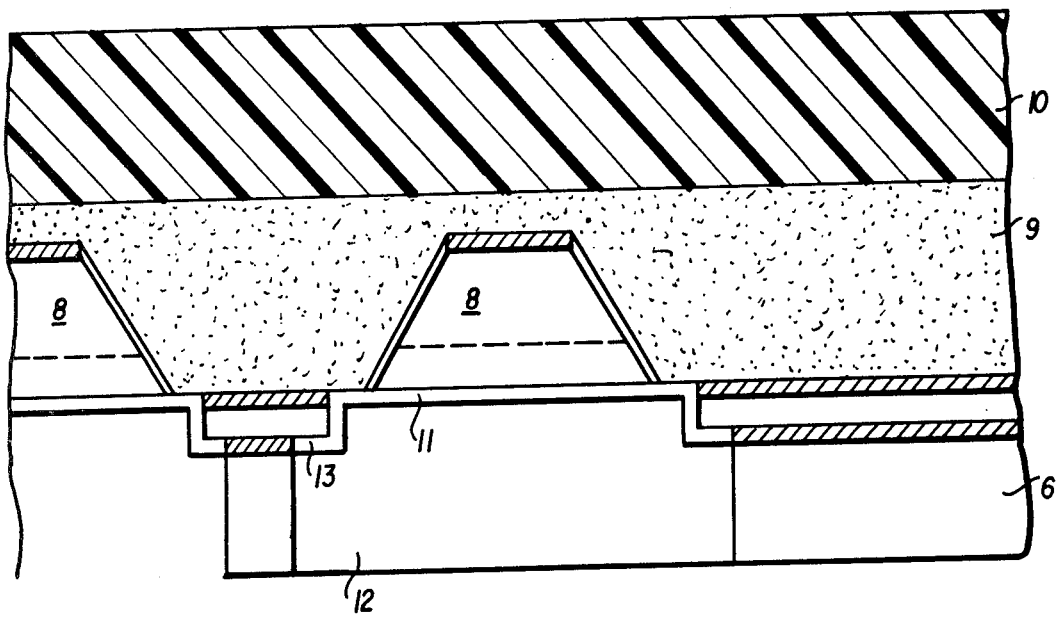
FIG. 5
FIG. 6
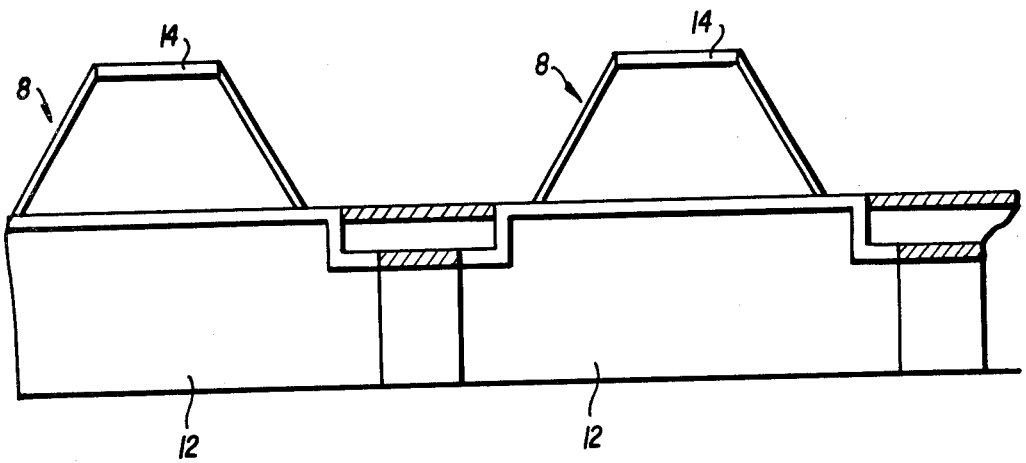

PROCESS FOR MAKING SEMICONDUCTOR DEVICES PASSIVATED BY AN INTEGRATED HEAT SINK

BACKGROUND OF THE INVENTION

The present invention relates to a process for making semiconductor devices passivated by an integrated heat sink. More particularly, the invention concerns a process in which passivation of a semiconducor device with an integrated heat sink takes place during manufacture of the device.

Within the scope of modern techniques of circuit hybrid integration, the necessity of utilizing chip-shaped semiconductor devices without a microcontainer and of the relative implications in terms of parasitics (capacities, leakage resistances and so on) is known.

However this requires that the utilized devices have a superficial protection which makes them free from the influence of the environmental conditions as much as possible.

This artifice does not involve particular difficulties for the devices operating under hot critical conditions for which, as a consequence, particular artifices for the heat sink are not necessary.

On the contrary, when devices operating at high levels of electric power, and for this reason thermal power are involved, it is absolutely necessary to provide structures having integrated heat sinks.

In these cases, the problem arising from the passivation of the surfaces presents some difficulties.

In present techniques, two processes are generally adopted:

(a) passivation with thermal oxide and successive assembling on the heat sink through thermocompression welding.

(b) vaporization and/or deposits of dielectric strata on turn-key devices having an integrated heat sink.

Both these techniques present some disadvantages. The first process resorts to the welding technique or thermocompression which always presents considerable difficulties as regards the reproducibility of the welding itself, the yield of the process, and the thermal, mechanical and electric characteristics of the finished product.

As far as the second process is concerned, passivated dielectrics which are deposited through vaporization, do not have, in general, sufficiently high electric qualities and, moreover, the very technique of vaporization does not insure in itself a uniform and complete protection of the MESA structure of the semiconductor device, because of shadow effects.

In addition, it is necessary to observe that both the thermocompression welding of the first process and the vaporization of dielectrics of the second one requires an additional phase because of their being carried out after the actual process of manufacture of the devices, resulting in a technological complication.

Therefore an object of this invention is to provide a process of making semiconductor devices with an integrated heat sink in which passivation of the surfaces is carried out during the actual manufacture of the devices themselves.

Another object of the invention is to provide semiconductor devices with an integrated heat sink in which thermal oxides having high dielectric qualities are used a process for making the superficial protection of the surfaces.

Moreover, another object of the present invention is to provide for semiconductor devices having an integrated heat sink without involving thermocompression welding techniques.

SUMMARY OF THE INVENTION

According to the present invention a semiconductor device is made by a sequence of operating steps each of which may be regarded as known in itself, but which as a whole provide for a particular technological cycle that substantially overcomes the above-mentioned defects.

Thus a process for making a semiconductor passivated by an integrated heat sink, is characterized by the following operating phases:

(a) carrying out on a face of a silicon N stratum a boron deposit by a thermal process so to obtain a strongly doped P+ stratum, (b) depositing on the said P+ stratum a silicon Nitride stratum, (c) laying down by vaporization a first doped multicrystalline silicon stratum on the said first silicon nitride stratum, (d) depositing a second silicon nitride stratum on the said first doped multicrystalline silicon stratum, (e) growing in thickness a multicrystalline silicon stratum, (f) thinning chemically the said silicon N stratum on the side opposite to that on which the said boron deposit has been carried out, (g) depositing a third silicon nitride stratum on the said thinned side of the said silicon N stratum, (h) masking and etching the said third silicon nitride stratum in order to describe the geometry of the device and then etching the silicon N stratum to make up a plate with a Mesa structure, (i) subjecting the plate to a thermal cycle in an oxidizing atmosphere to cause boron diffusion in the silicon with P+/N bonding and at the same time oxidation of the surfaces of the said Mesa structure, (j) glueing the said plate through a bonding agent to a working support, (k) masking and etching the said multicristalline silicon stratum in thickness and the said second silicon nitride stratum in order to delineate a growth seats of a dissipator, (l) removing through masking and etching the said first multicrystalline silicon stratum and the said first silicon nitride stratum inside the said growth seats of the dissipator on an area that is slightly smaller than that of the said growth seats of the dissipators;

(m) evaporating a metallic sheet for the contact on the said P+ stratum and then it only for lining of the growth seats of the dissipators;

(n) carrying out electrolytic growth of the silver thermal dissipators;

(o) removing the said working support and the said bonding agent;

(p) masking and etching the areas of the said third silicon nitride stratum up to find the superior surface of the silicon N;

(q) evaporating a metallic sheet for the contact on the said silicon and to remove it, later on, through photoengraving so as to leave it only on the said superior silicon N areas; and (r) splitting mechanically the single devices obtained by the previous working phases.

BRIEF DESCRIPTION OF DRAWINGS

The invention is described with reference to the 5 drawings which illustrate stage by stage the manufacture of a pair of semiconductor devices.

FIG. 1 is a cross-section through a multistrata sheet showing the initial manufacturing stages, FIG. 2 is a cross-section through the sheet after the addition of further strata, FIG. 3 is a cross-section through the sheet after the formation of two MESA structures, FIGS. 4 and 5 are cross-sections through the sheet when bonded to a support, and FIG. 6 is a cross-section through the sheet in its final manufacturing stages.

DETAILED DESCRIPTION OF PREFERRED EMBODIMENT 1 shows a silicon N stratum one onto which boron has been deposited through a thermal process to obtain a highly doped P+ stratum 2. Such stratum 2 will be the local source for the next process of thermal diffusion, that is necessary to make up a P+/N bond.

On the P+ stratum, a stratum of silicon nitride ($SI_3N_4$), 3, is deposited, by a sputtering technique.

The thickness of the silicon stratum is for example about $150\mu$ and that of the $SI_3N_4$ is about 500–1000 Å.

FIG. 2 shows the semiconductor slice, after having undergone the following and successive phases of the manufacturing cycle:

(a) The deposit in a vaporization phase of a doped multicrystalline silicon stratum 4. As will be later seen this stratum will electrically interconnect those areas in which thermal dissipators will have their seats in order to allow the electrolitic deposit of their making-up.

The thickness of stratum 4 is typically about $1\mu$.

(b) The deposit through sputtering of a silicon nitride stratum 5 that is equal to stratum 3 in every aspect.

(c) The growth of a stratum 6 with a multicrystalline silicon thickness that will be used as a support for the next silicon substratum 1 during the next phase of chemical thinning. The stratum 6 has a characteristic thickness of about $50\mu$.

(d) The chemical thinning of the silicon N stratum 1 with reduction of its thickness up to $20-40\mu$.

(e) The deposit of a silicon nitride stratum 7, that is analogous to the previous ones, on the silicon surface that has undergone the thinning.

FIG. 3 shows the working phases which delineate the devices.

The working phases are not described one by one in detail, because they are individually known in the art and, the inventive essence of the process is made up by the whole manufacturing cycle.

Therefore FIG. 3, shows the slice of semiconductor after having undergone the following operations:

(a) masking and etching of the stratum 7 in order to the delineate the geometry of the devices, followed by chemical etching of the silicon substratum 1 to form Mesa structures 8.

(b) thermal processing of the devices to provide boron diffusion in the silicon with the formation of a P+/N bond, carried out in an oxidizing atmosphere in order to allow simultaneous oxidation of the surfaces of the Mesa structures and therefore the protection required with high dielectric characteristics.

The following phases are shown in the FIG. 4 and include:

(a) glueing of the slice through a bonding agent 9 onto working support 10;

(b) masking and etching of the strata 6 and 5, respectively of multicrystalline silicon and of silicon nitride, so to delineate growth seats of dissipators 6A.

Now with reference to FIG. 5, a process of photoengraving allows the strata 4 and 3 to be removed, the strata 4 and 3 being respectively of multicrystalline silicon and of silicon nitride inside the seats 11 of the dissipators.

The area which these strata are removed is slightly smaller than that of the seats of the dissipators.

This leaves a light stripe of multicrystalline silicon 3 to be exposed to subsequent metallic vaporization, that now will be pointed out so that electric continuity will be ensured, through the multicrystalline silicon stratum, among the various areas of metallic deposit that will be formed. The next phase provides for the vaporization of a metallic sheet 11 (for instance chromium-gold) that is necessary for the contact on the surface P+.

For the successive photoengraving, this metallic stratum is left only in the growth seats of the dissipators. Therefore the next step is that of electrolytic growth of silver thermal dissipators 12.

FIG. 6 shows the process in its final phases, that are:

(a) removal of the support 10 and of the bonding agent 9;

(b) chemical etching of the silicon nitride stratum 7 to exposed the silicon N;

(c) vaporization of a metallic sheet 14 for contact on the silicon and then removal of sheet 14 for the photoengraving in order to leave it only on the superior zones of contact of the devices.

Now the single devices having been formed in unison, they can be easily split without involving cutting operations, and because of the low mechanical strength of the strata 3 and 4 because of their small thickness.

The above-described figures show merely the approximate and illustrative purpose of the various working-phases of an embodiment of this invention and that they do not observe a particular scale of the dimensions involved. This is due to the high amplifications of the thicknesses of the various parts of the devices. The above-described working cycle can be advantageously utilized for a wide range of semiconductor devices such as silicon Impatt devices.

We claim:

1. Process for making a semiconductor device passivated by an integrated heat sink comprising:

(a) providing a silicon N stratum and depositing boron by a thermal process onto a face of said stratum so to obtain a strongly doped P+ stratum (b) depositing on the said P+ stratum a first silicon nitride stratum (c) laying down by vaporization of a first doped multicrystalline silicon stratum on the said first silicon nitride stratum (d) depositing a second silicon nitride stratum on the said first doped multicrystalline silicon stratum (e) growing in thickness a multicrystalline silicon stratum (f) chemically thinning the said silicon N stratum on the side opposite to that on which the said boron deposit has been carried out (g) depositing a third silicon nitride stratum on the said thinned side of the said silicon N stratum (h) masking and etching the said third silicon nitride stratum to delineate the geometry of the device and then etching the silicon N stratum to form a plate having a Mesa structure
(i) subjecting the plate to a thermal cycle in an oxidizing atmosphere to cause boron diffusion in the silicon with the formation of a P+/N bond and at the same time the oxidation of the surfaces of the said Mesa structure
(j) glueing the said plate with a bonding agent to a working support
(k) masking and etching the said multicrystalline silicon stratum and the said second silicon nitride stratum to delineate a growth seat for a dissipator
(l) removing through masking and etching the said first multicrystalline silicon stratum and the said first silicon nitride stratum inside the said growth seat over an area that is slightly smaller than that of the said growth seat
(m) evaporating a metallic sheet for the contact on the said P+ stratum and then photoengraving it only for the lining of the growth seat
(n) carrying out electrolytic growth of a silver thermal dissipator
(o) removing the said working support and the bonding agent
(p) masking and etching the areas of the said third silicon nitride stratum up to expose a surface of the silicon N and
(g) evaporating a metallic sheet to contact of the said silicon and subsequently removing said sheet through photoengraving so to leave a sheet portion only on the said exposed silicon N surface.

2. Process according to claim 1 wherein said silicon nitride strata are deposited by cathodic sputtering.

3. Process according to the claim 1 wherein said silicon nitride strata have a thickness of about 500–1000 Å.

4. Process according to the claim 1 wherein said first multicrystalline silicon stratum has a thickness of about 500–1000 Å.

5. Process according to the claim 1 wherein said silicon stratum has a thickness of $50\mu$.